United States Patent [19]
Feger et al.

[11] Patent Number: 6,130,472
[45] Date of Patent: Oct. 10, 2000

[54] MOISTURE AND ION BARRIER FOR PROTECTION OF DEVICES AND INTERCONNECT STRUCTURES

[75] Inventors: Claudius Feger, Croton-on-Hudson; John Patrick Hummel, Millbrook, both of N.Y.

[73] Assignee: International Business Machines Corporation, Armonk, N.Y.

[21] Appl. No.: 09/122,353

[22] Filed: Jul. 24, 1998

[51] Int. Cl.⁷ .................................................. H01L 29/40
[52] U.S. Cl. .......................................... 257/643; 257/759
[58] Field of Search .................................. 257/642, 643, 257/759

[56] References Cited

U.S. PATENT DOCUMENTS 5,073,814  12/1991  Cole, Jr. et al. ......................... 257/643
5,945,203   8/1999  Soane ...................................... 257/643

OTHER PUBLICATIONS

D.W. Galipeau, et al., "A Surface Acoustic Wave Sensor Study of Polyimide Thin Film Surface Treatments—Effect on Water Uptake", J. Adhesion Sci. Technol., vol. 8, No. 10, pp. 1143–1156 (1994).

*Primary Examiner*—David Hardy
*Attorney, Agent, or Firm*—Scully, Scott, Murphy & Presser; Robert M. Trepp, Esq.

[57] ABSTRACT

The present invention provides polymeric materials that can be used as a moisture/ion barrier layer for inhibiting the penetration of moisture and/or ions for coming into contact with the metal wiring found in chip level interconnects. The present invention also provides a means to protect the chip backside from being contaminated by metal atoms or metal ions which are capable of forming mobile silicides, which can migrate to the active sites of the semiconductor and destroy them. The present invention further provides methods of forming such polymeric barrier layers on at least one surface of an interconnect structure.

8 Claims, 3 Drawing Sheets

MOISTURE AND ION BARRIER FOR PROTECTION OF DEVICES AND INTERCONNECT STRUCTURES

DESCRIPTION

Technical Field

The present invention provides moisture and/or ion barriers that are capable of protecting silicon devices and wiring, e.g. Cu wiring, found in chip level interconnects from moisture and/or ions. Specifically, the present invention utilizes polymeric compounds such as hydrocarbons and fluoropolymers as a moisture and/or ion barrier layer and has found that such polymeric compounds inhibit the penetration of water and/or metal ions into integrated circuit (IC) interconnect structures and silicon devices. The polymeric barrier layer of the present invention replaces the inorganic barrier layers that are currently employed in the semiconductor industry for protecting such structures and devices. The polymeric barrier layer of the present invention can be used for frontside as well as backside protection of silicon devices. The present invention also provides IC interconnect structures which contain the polymeric barrier layer of the present invention. As stated above, the polymeric barrier layer of the present invention can be found on the frontside as well as the backside of the structure.

BACKGROUND OF THE INVENTION

Presently in IC manufacturing, the wiring in chip level interconnects and the device itself are normally protected from moisture by various layers of inorganic dielectrics consisting of oxides or nitrides such as silicon nitride and/or silicon oxide. In addition to being effective as moisture barrier layers, inorganic dielectrics are also excellent barriers against the migration of ions which can be present as contaminants or in processing fluids such as etching solutions. Such ions may corrode the metal wiring as well as migrate to the semiconductor itself wherein the migrating ions may form fast moving silicides which essentially destroy the semiconductor device.

A portion of a typical prior art IC chip containing inorganic barrier layers is shown in FIG. 1. Specifically, FIG. 1 comprises substrate 10 composed of a processed semiconductor material such as Si which contains active device regions such as transistors (not shown in the drawing). On top of substrate 10 are one or more inorganic interconnect levels 12 (only one is shown in the drawings) which contain vias 14, metal lines 16 and metallic pads 18. Todays advanced chips typically have 6–8 levels of metal wiring and thus of dielectric levels. The inorganic interlevel interconnect is capped off by two layers consisting of a silicon nitride ($Si_3N_4$) layer 22 on top of a silicon dioxide ($SiO_2$) layer 20. A polymer layer 24 composed of a polyimide, for example, is usually applied on top of the capping layers as a scratch guard and stress buffer layer. Capping layers 20 and 22 and polymer layer 24 are opened down to metallic pads 18 so as to allow a connection from the chip interconnect structure to the next level electronic package. The connection is made either by solder balls, C4 (Controlled Collapse Chip Connection) technology or another connection technology such as wire bonding or TAB bonding. The structure shown in FIG. 1 contains a C4 solder ball 26.

Despite being successfully employed as barrier layers in IC interconnect structures, inorganic dielectrics such as $SiO_2$ and $Si_3N_4$, i.e. capping layers 20 and 22, are very brittle. The brittleness is the main problem because the organic dielectrics have higher expansion coefficients and the stress caused by expansion can crack the capping layer. The dielectric constant is the reason why organic dielectrics are used as interlevel dielectrics. Thus, much research endeavor has been applied in developing interlevel dielectrics which are based on organic polymers such as polyimides, polybenzocyclobutanes (BCBs) and poly(arylene ethers). These organic dielectric materials have a lower dielectric constant than inorganic materials like $SiO_2$ and thus reduce signal delays. While organic dielectric materials can exhibit sufficiently low dielectric constants, they tend to be permeable to moisture and other contaminants. This permeability problem is particularly detrimental to Cu wiring which can oxidize in the presence of moisture. In addition, ions such as iron, copper, sodium, and/or potassium ions among others can corrode the Cu wiring. Furthermore, ions such as iron and copper can potentially migrate to the semiconductor where they form fast moving silicides which may destroy the device.

A typical prior art structure that contains an interlayer dielectric made from an organic polymer is shown in FIG. 2. Specifically, FIG. 2 comprises substrate 30 composed of a processed semiconductor material such as Si which contains active device regions such as transistors (not shown in the drawings). On top of this device level is an organic interconnect level 32 which contains vias 34, metal lines 36 and metallic pads 38. The organic interconnect level may comprise several layers of organic dielectric materials. Specifically, the organic interconnect level is composed of a low dielectric constant organic material which is capped by three layers of inorganic materials consisting from bottom to top of a $Si_3N_4$ layer 40, a $SiO_2$ layer 42 and a layer of $Si_3N_4$ 44. Capping layers 40, 42 and 44 serve as a moisture and/or ion barrier for the low dielectric constant material below. A polymer layer 46 composed of a polyimide, for example, is usually applied on top of capping layers 40, 42 and 44 as a scratch guard/stress buffer layer. Capping layers 40, 42 and 44 and polyimide layer 46 are opened to expose metallic pads 38 and then a connection from the chip interconnect structure to the next level electronic package is made either by solder balls, C4 (Controlled Collapse Chip Connection) technology, or another connection technology such as wire bonding or TAB bonding. In FIG. 2, the connection is made by utilizing C4 solder ball 48.

The production of the aforementioned capping layers in FIG. 2 requires extra processing steps. Furthermore, these capping layers are rather brittle and can easily be cracked by thermal expansion of the underlaying organic dielectric material.

In view of the drawbacks mentioned hereinabove concerning the use of organic dielectric interlevels and thus the need for inorganic capping layers, there is a need to provide a flexible barrier layer which is compatible with the organic dielectric interlayer and prevents moisture and/or ions from penetrating to the Cu wiring of such IC interconnect structures or to the semiconductor device itself.

SUMMARY OF THE INVENTION

One object of the present invention is to provide a moisture/ion barrier layer which is compatible with the low dielectric organic material found in the interconnect level which serves to protect wiring, e.g. Cu wiring, and the semiconductor substrates of ICS and other interconnect structures.

Another object of the present invention is to provide a moisture/barrier layer which replaces the inorganic barrier layers found in prior art IC interconnect structures like the kind illustrated in FIG. 2 and if applied after the chips are diced from the wafer, the moisture/barrier layer can protect the sidewalls of the diced edge.

A further object of the present invention is to provide a method of providing such a moisture/ion barrier layer so that the two above objectives are met.

These and other objects and advantages are achieved in the present invention by utilizing a polymeric barrier layer that comprises either a fluoropolymer, a polychlorofluoropolymer or a hydrocarbon. The hydrocarbon barrier layer can be aromatic, aliphatic or aromatic/aliphatic. The polymeric barrier layer of the present invention replaces the inorganic capping layers that are typically present in prior art IC interconnect structures.

Specifically, the present invention provides interconnect structures which comprise an active device containing semiconductor substrate; an organic dielectric interconnect structure on top of said substrate, wherein said organic dielectric interconnect structure contains metallic vias, lines and pads embedded in one or more layers, where said metallic pads serve to make contact with a next level package by means of solder balls, wire bonding or TAB connections; a polymer scratch guard/stress buffer layer on said organic dielectric interconnect structure; and a polymeric barrier layer on said polymer scratch/stress buffer layer, wherein said polymeric barrier layer comprises a fluoropolymer, a polychlorofluoropolymer or a hydrocarbon.

Another aspect of the present invention relates to a method of forming a polymeric barrier layer on an interconnect structure. Specifically, the method of the present invention comprises forming a polymeric barrier layer on at least the frontside (business side) of a previously fabricated IC interconnect structure, wherein said polymeric barrier layer comprises a fluoropolymer, a polychlorofluoropolymer or a hydrocarbon.

Another aspect of the present invention relates to a method of protecting the diced edge of a chip from ion and moisture ingress by applying the inventive polymeric barrier layer to semiconductor dies after dicing. This will coat the now exposed edges and prevent contamination of the dielectric and wires, wherein said polymeric barrier layer comprises a fluoropolymer, polychlorofluoropolymer or a hydrocarbon.

Another aspect of the present invention relates to a method of protecting the backside of the semiconductor from ionic or metallic contamination which is able to form mobile silicides. This is accomplished in the present invention by providing the inventive polymeric barrier layer to the backside of the structure.

DETAILED DESCRIPTION OF THE PRESENT INVENTION

Figure 1:
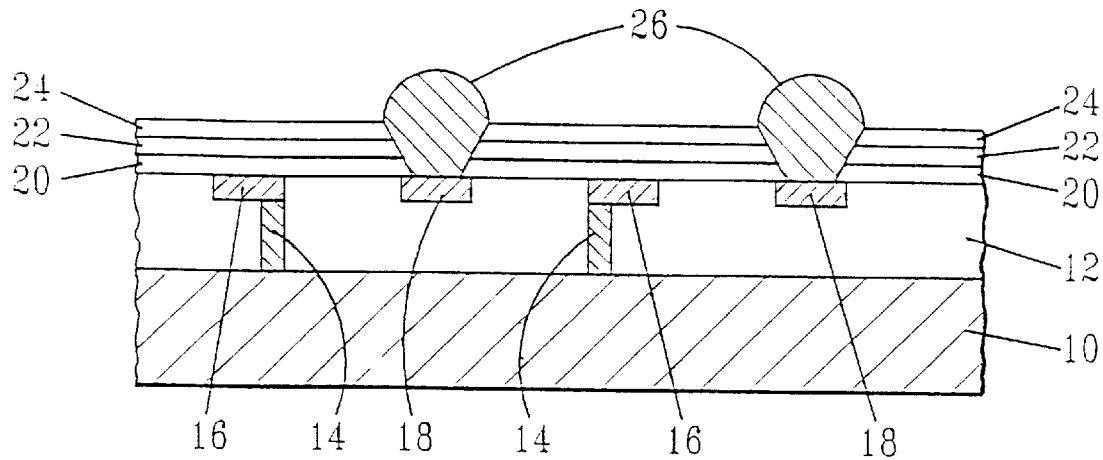
FIG. 1 is a cross-sectional view of a prior art IC interconnect structure containing inorganic dielectric interlayers.
Figure 2:
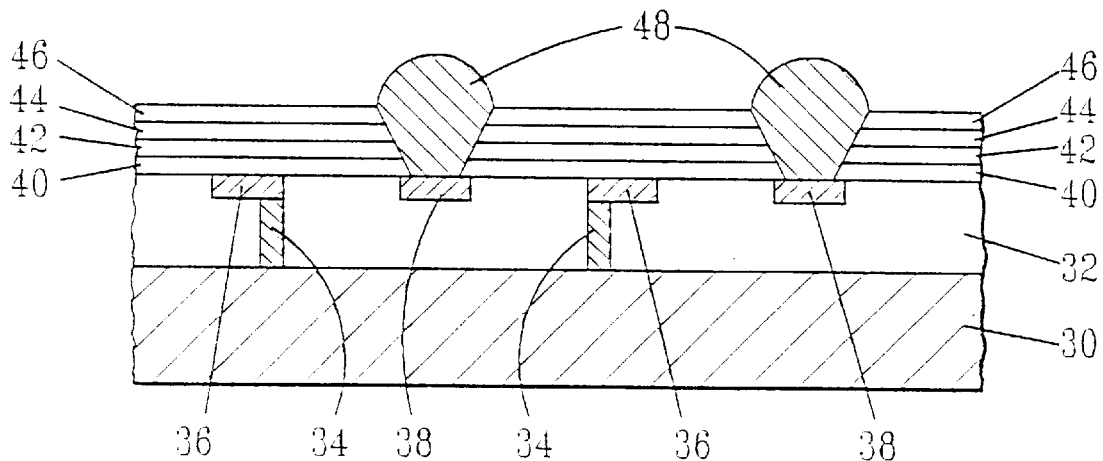
FIG. 2 is a cross-sectional view of a prior art IC interconnect structure containing an organic dielectric interlevel capped with a $Si_3N_4/SiO_2/Si_3N_4$ barrier layer and a polymer scratch guard/stress buffer layer.

As stated hereinabove, the present invention provides a polymeric material which serves as a barrier layer for preventing moisture and/or ions from coming into contact with metal wiring found in IC interconnect structures and preventing formation of highly mobile silicides in the substrate device. In prior art IC structures, as shown in FIGS. 1 and 2, the interconnect structure and the chip are protected from moisture and ions by layers of inorganic dielectric materials such as $SiO_2$ and $Si_3N_4$. Inorganic dielectric materials, however, have relatively high dielectric constants (3.5 or above) and are highly brittle and thus it is desirable to replace them in IC devices. Low dielectric constant alternatives comprising organic materials have also been suggested; however, prior art organic materials are not hermetic, i.e. moisture and ions can readily migrate through the low dielectric constant material and if they come in contact with the metal wiring corrosion can occur which could eventually lead to electric failure of the chip. Furthermore, mobile silicide forming ions and metal atoms that can migrate through the organic interconnect materials can destroy the device if they reach the chip silicon. Since prior art barrier layers are brittle and difficult to manufacture, it would be highly useful to provide an organic, flexible barrier layer that inhibits the penetration of moisture and/or ions to the metal interconnect structure and the semiconductor.

Figure 3:
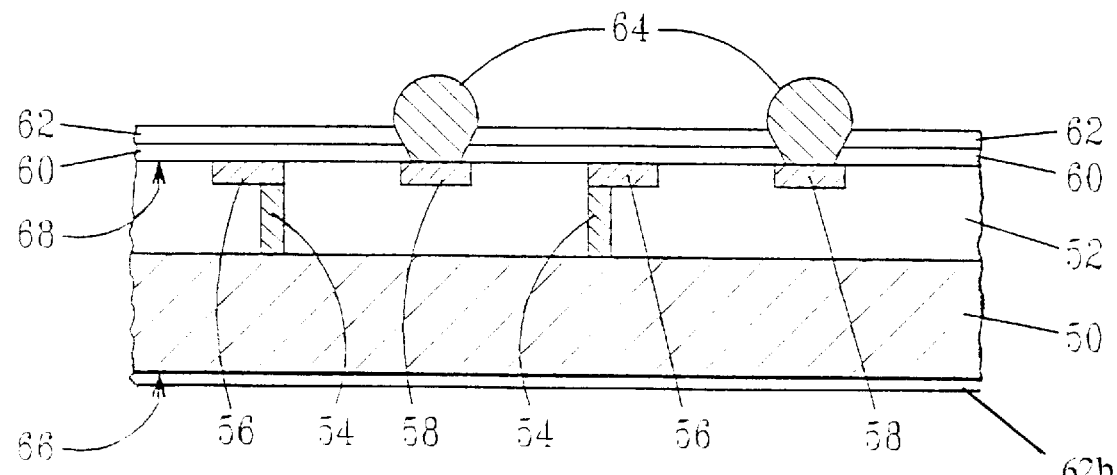
FIG. 3 is a cross-sectional view of an IC interconnect structure containing a polymeric barrier layer of the present invention.

The foregoing problem is solved in the present invention by utilizing a polymeric material as a barrier layer which is formed on at least the frontside of a previously fabricated IC interconnect structure on top of the polymer scratch guard/ stress buffer layer as illustrated in FIG. 3. The term "frontside" is used herein to denote the surface of the IC structure which contains the organic dielectric interconnect structure and the metal connections to the next level package. The polymeric barrier layer of the present invention can optionally be applied to the backside of the structure either before or after fabrication of the interconnect structure.

The present invention will now be described in more detail by referring to FIG. 3 which shows a schematic IC interconnect structure containing a polymeric material in accordance with the present invention as a barrier layer replacing the inorganic capping layers of FIG. 2 but being on top of the scratch guard/stress buffer layer not below it. It is also possible to apply the polymeric barrier layer of the present invention below the scratch guard/stress buffer layer but this may limit the choices of barrier layers to non-perfluoropolymers because the latter are difficult to adhere to.

Specifically, FIG. 3 comprises a substrate 50 composed of a processed semiconductor material such as Si, Ge, GaAs, InAs and InP which contains active device regions such as transistors. For clarity, the active device regions are not shown in the drawings of the present application. On top of substrate 50 is an organic dielectric interconnect structure 52 which contains vias 54, metal lines 56 and metallic pads 58 embedded therein. The interconnect structure is capped off by a polymer layer 60 which is composed of a material which acts as a scratch guard/stress buffer layer. On top of layer 60 is the polymeric barrier layer of the present invention. Polymeric barrier layer 62 and polymer scratch guard/ stress buffer layer 60 are opened down to metallic pads 58 and the opened region is used for connecting the chip interconnect structure to the next level electronic package which is made either by solder balls, C4 (Controlled Collapse Chip Connection) technology, or another connection technology such as wire bonding or TAB bonding. In FIG. 3, C4 solder ball 64 is shown as the connecting means.

It is emphasized that the interconnect structure of FIG. 3 below polymeric barrier layer 62 and scratch guard/stress buffer 60 is the same as that shown in FIG. 2, below the $Si_3N_4/SiO_2/Si_3N_4$ inorganic capping layers. The structure not containing the polymeric barrier layer is prepared using conventional techniques well known to those skilled in the art. Since those techniques are well known to those skilled in the art, a detailed explanation of the same will not be given herein.

Organic dielectric interconnect structure 52 on top of the substrate 50 shown in FIG. 3 is composed of at least one layer of an organic dielectric material that has a dielectric constant lower than $SiO_2$ (<4.0). Such organic dielectric materials are permeable to moisture and ion migration; they are well known to those skilled in the art and include materials, such as, but not limited to: diamond like carbon (DLC), fluorinated DLC, sesquisiloxanes (HSSQ), methyl sesquisiloxanes (MSSQ), polyimides, parylene-N, benzocyclobutanes, fluorinated polyimides, poly(arylene ethers), parylene-F, Teflon AF, poly(naphthalenes), poly (norbonenes), foams of polyimides, xerogels, porous PTFE, and porous MSSQ.

The lines, vias and pads shown schematically in FIG. 3 are composed of conductive metals including, but not limited to: Cu, W, Cr, Al, Ag, Au, Pt, Mo and alloys thereof. Of these conductive metals, it is highly preferred that at least the majority of the metallic lines be composed of Cu. In a highly preferred embodiment, Cu is used as line 56, via 54 and pad 58. FIG. 3 further shows the presence of a solder ball 64 as an example of a conductive connection to the next level package. Metals used for these conductive connections to the next level are well known to those skilled in the art and can be pure metals as well as metal alloys with or without Pb. The connection is formed using techniques well known to those skilled in the art. For example, layers 60 and 62 are etched down to metallic pads 58 using standard lithographic techniques including dry or chemical etching and thereafter the solder ball is formed by plating.

In accordance with the present invention, an IC interconnect structure minus polymeric barrier layer 62 is first fabricated using techniques well known to those skilled in the art and then a polymer scratch guard/stress buffer layer 60 is applied thereto. Suitable polymers for use as scratch guard/stress buffer layer include, but are not limited to: any of the polymers used in forming organic dielectric interconnect structure 52.

On top of this structure, is applied the polymeric organic barrier layer of the present invention. The polymeric barrier layer of the present invention comprises either a fluoropolymer, a polychlorofluoropolymer, or a hydrocarbon. Of these materials, fluoropolymers and polychlorofluoropolymers are highly preferred since they provide excellent barrier layers which substantially prevent moisture and/or ions from penetrating into the structure.

Suitable fluoropolymers that can be employed in the present invention include, but are not limited to: polytetrafluoroethylene (PTFE), amorphous copolymers of PTFE and perfluoro (2,2-dimethyl-1,3-dioxole) (PDD), known under the tradename (DuPont) Teflon AF; and polychlorofluoropolymers, known under the tradename (Allied-Signal) Aclon. Of these fluoropolymers, Teflon AF is highly preferably preferred in the present invention.

Examples of hydrocarbons that can be utilized in the present invention include, but are not limited to: aliphatic hydrocarbons such as polynorbonenes, aromatic hydrocarbons such as polyphenylenes and aliphatic/aromatic hydrocarbons such as parylenes. Of these hydrocarbons, polynorbonenes and parylenes are particularly preferred hydrocarbons.

Polymeric barrier layer 62 is formed using any technique which is capable of providing the polymeric barrier layer to the frontside of the IC structure, i.e. the side containing the metallic connection to the next level package and the polymeric outer layer. Suitable techniques that can be employed in the present invention include dip coating, spin coating, Langmuir-Blodget film fabrication, plasma deposition, evaporation, sputtering or chemical vapor deposition. A preferred method of forming polymeric barrier layer is by dip coating since this method can also coat the backside of the structure and thus also protects that side from ion migration. The backside is referenced as 66 in FIG. 3 whereas the frontside is referenced as 68. FIG. 3 also shows the presence of an optional polymeric barrier layer 62b which is applied to the backside (66) of the chip.

The conditions employed in forming polymeric barrier layer 62 vary depending upon the specific technique used. In each instance, however, the conditions must be capable of forming a polymeric barrier layer that has sufficient thickness so as to prevent moisture and/or ions from penetrating the backside and/or frontside of the IC structure. Generally, the conditions of applying polymeric barrier layer 62 are sufficient so as to provide a barrier layer that has a thickness of from about 0.1 nanometer to about 5 micrometers. More preferably, the conditions are sufficient to provide a polymeric barrier layer having a thickness of from about 1 nanometer to about 1.5 micrometers.

As stated above, dip coating is the preferred technique used in the present invention for forming polymeric barrier layer 62 from fluoropolymers and polychlorofluoropolymers. This is because dip coating is a simple technique which does not waste material as several other techniques such as spin coating. In the case of fluoropolymers such as Teflon AF, dip coating provides a thin polymeric barrier layer that has a thickness of less than 0.01 micrometers which is extremely efficient in preventing moisture and/or ions from penetrating into the IC structure. Generally when dip coating is used, the polymeric material is a dilute solution which contains, in addition to the polymer, a solvent which is capable of dissolving or suspending the polymer. Suitable solvents which can be utilized in the present invention to dissolve the fluoropolymer include perfluorinated alkanes or alkane ethers which do not interact with any of the materials found in the IC interconnect structure.

It should be noted that the polymeric barrier layer may be applied before or after dicing of the IC interconnect structure. In a preferred embodiment of the present invention, it is preferred that polymeric barrier layer 62 be applied prior to dicing.

As stated above, polymeric barrier layer 62 prevents moisture and/or ions from penetrating into the final IC interconnect structure. The moisture prevention is exemplified by the fact that IC structures containing polymeric barrier layer 62 exhibit little or no water uptake. Ion migration prevention is manifested by the fact that the Cu wiring does not significantly corrode upon extended use of the IC structure.

The following examples are given to illustrate the scope and spirit of the present invention. Because these examples are given for illustrative purposes only, the invention embodied therein should not be limited thereto.

EXAMPLE 1

A test structure resembling a scratch guard/buffer layer over an IC interconnect structure was manufactured by applying a PMDA-ODA polyamic acid coating on a quartz substrate representing the interconnect structure. The polyamic acid was converted to polyimide by curing at 400° C. following methods well known to those skilled in the art. The polyimide coating thus obtained is identical to scratch guard/buffer layer coatings typically used in the IC industry. The quartz substrate contained two sets of interdigitated finger electrodes which had been manufactured previously following methods well known to those skilled in the art. The interdigitated electrode pairs were designed so as to function as an emitter and a receiver of surface acoustic waves. The surface acoustic waves are capable of probing weight changes in the coating which is manufactured in the path between them.

Figure 4:
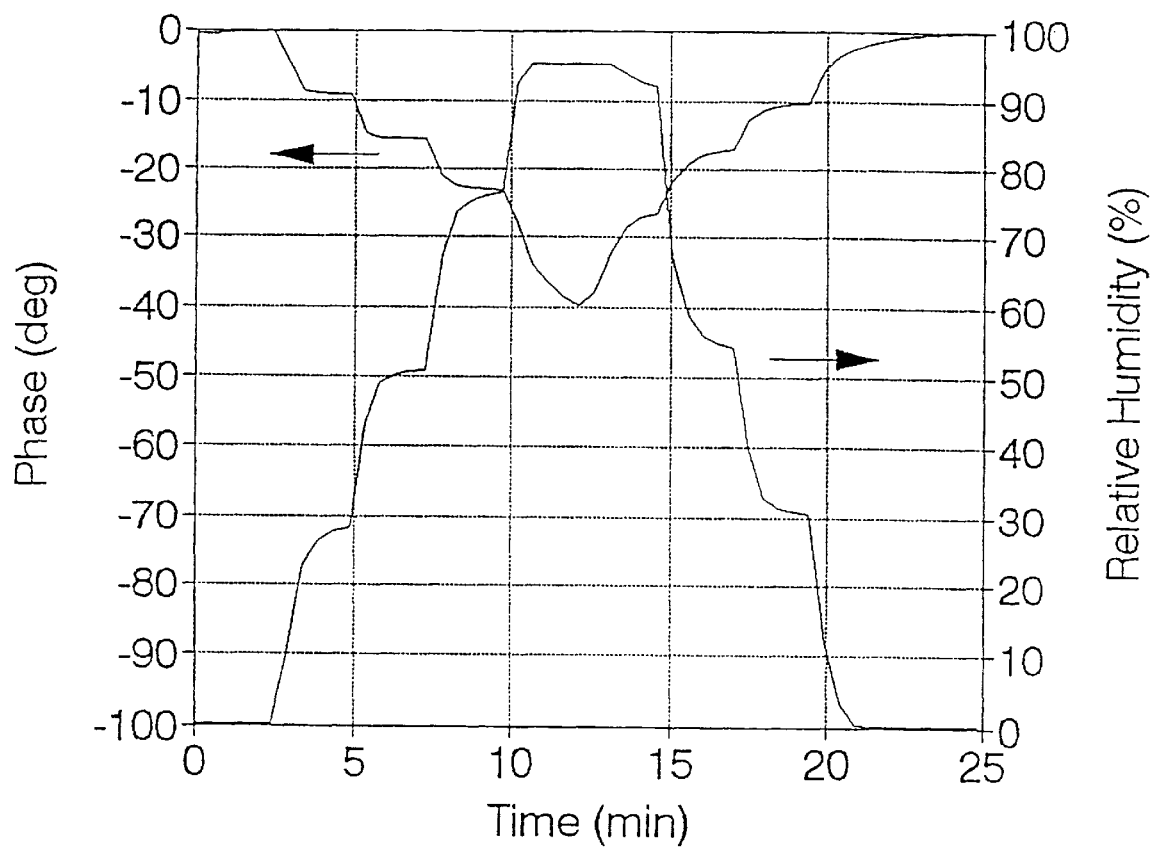
FIG. 4 shows the surface acoustic wave response of a scratch guard/stress buffer film to water uptake at various relative humidities.
Figure 5:
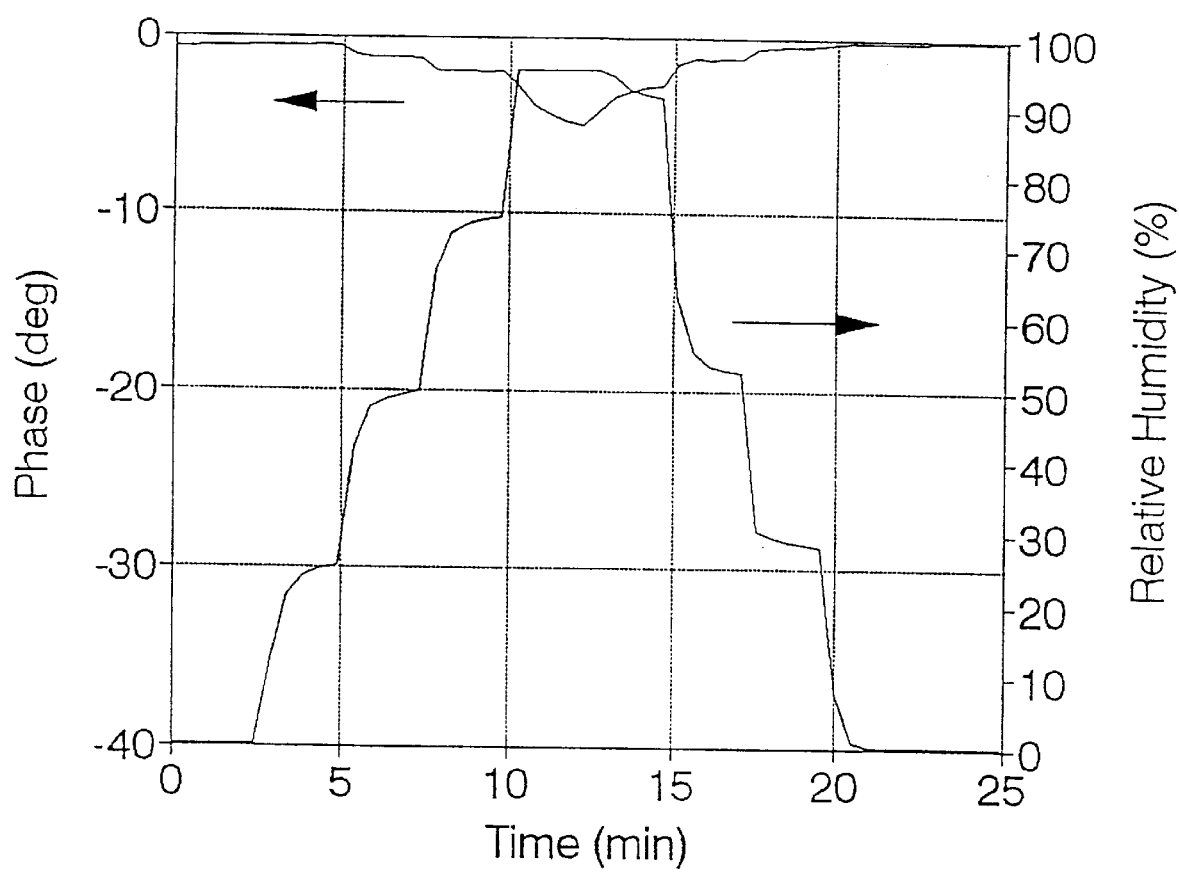
FIG. 5 shows the surface acoustic wave response of a scratch guard/stress buffer film that was dip coated in a very dilute solution of a fluorocopolymer of PTFE and PDD to water uptake at various relative humidities.

Upon exposure to moisture, the polyimide layer picks up a certain amount of water as shown in FIG. 4; the exact amount of water depends on the relative humidity of the environment. The polyimide coatings is then dipped into a dilute solution of Teflon AF in a perfluoro hydrocarbon solvent such as Fluorinert 70 and dried. The water up-take of the polyimide layer after this exposure is shown in FIG. 5. It is easily seen that the Teflon AF treatment reduces the weight response measured by the surface acoustic wave signal significantly. In fact, this response is likely caused only by adsorption of water on top of the polyimide film not by residual adsorption of water in the polyimide film. This experiment shows the effectiveness of the Teflon AF treatment in preventing water from penetrating the scratch guard/buffer guard.

The thickness of the film on the polyimide layer is actually difficult to ascertain. XPS measurements appear to indicate that instead of forming a discrete film the Teflon AF material seems to penetrate at least part of the polyimide film possibly lodging in pores of the polyimide. More concentrated solutions of Teflon AF will eventually form a discrete film on top of the polyimide which do not add, however, to the water and ion protection effectiveness of the coating.

EXAMPLE 2

A piece of glass ceramic which contains large amounts of $SiO_2$ and thus can serve as a model of a silicon surface was exposed to a dilute solution of Teflon AF in Fluorinert 70. Water contact angle measurements showed that this treatment left a very thin fluoropolymer film on the exposed $SiO_2$-containing surface. Electron scattering chemical analysis (ESCA also called XPS) indicated that besides the presence of Teflon AF, a modification of the $SiO_2$ surface may have occurred. In any case, the Teflon AF treatment rendered the treated surfaces water repellent while, before the treatment, water easily wetted the surface. Because ions are typically carried in water and the described Teflon AF treated surface are not wetted by water, ionic contaminants cannot penetrate through these barriers. It is a physical characteristic of non-polar, organic compounds to act as a moisture and ion barrier.

While this invention has been particularly shown and described with respect to preferred embodiments thereof, it will be understood by those skilled in the art that the foregoing and other changes in form and detail may be made without departing from the spirit and scope of the invention.

Having thus described our invention in detail, what we claim by the Letters Patent is:

1. A chip level interconnect structure comprising at least one dielectric interconnect structure comprising at least one dielectric layer having one or more layers of metallic vias, lines and pads embedded therein, said metallic vias, lines and pads are composed of a conductive metal selective from the group consisting of Cu, W, Cr, Al, Ag, Au, Pt, Mo and alloys thereof, wherein said metallic pads are used for connection to a next level package bonding; a polymer scratch guard/stress buffer layer on said dielectric interconnect structure covering any exposed metallic lines and vias in said interconnect structure; and a polymeric barrier layer on said polymer scratch guard/stress buffer layer, wherein said polymeric barrier layer comprises a fluoropolymer, a polychlorofluoropolymer or a hydrocarbon polymer, and said polymeric barrier layer substantially prevents moisture, ions or both from coming into contact with said metallic vias, lines and pads embedded in said structure.

2. The interconnect structure of claim 1 wherein said dielectric interconnect structure comprises an organic material having a dielectric constant lower than 4.0.

3. The interconnect structure of claim 2 wherein said dielectric interconnect structure is composed of diamond-like carbon (DLC), fluorinated DLC, fluorinated $SiO_2$, sesquisiloxanes (HSSQ), methyl sesquisiloxanes (MSSQ), polyimides, parylene-N, benzocyclobutanes, fluorinated polyimides, poly(arylene ethers), parylene-F, Teflon AF, poly(naphthalenes), poly(norbonenes), foams of polyimides, xerogels, porous PTFE or porous MSSQ.

4. The interconnect structure of claim 1 wherein said metallic lines, vias and pads are each composed of Cu.

5. The interconnect structure of claim 1 wherein said polymeric barrier layer is a fluoropolymer selected from the group consisting of polytetrafluoroethylene (PTFE) and amorphous copolymers of PTFE and perfluro (2,2-dimethyl-1,3-dioxole.

6. The interconnect structure of claim 1 wherein said polymeric barrier layer is a hydrocarbon selected from the group consisting of polynorbonenes, polyphenylenes and parylene.

7. The interconnect structure of claim 1 further comprising another polymeric barrier applied to a backside of the structure.

8. The interconnect structure of claim 1 wherein said polymer scratch guard/stress buffer layer is a polyimide, parylene-N, benzocyclobutane, fluorinated polyimide, poly (arylene ether), parylene-F, Teflon-AF, poly(naphthalene), poly(norbanene), foam of polyimide and porous PTFE.

* * * * *